United States Patent

Hara

Patent Number: 5,598,087
Date of Patent: Jan. 28, 1997

[54] SYSTEM FOR MONITORING RESIDUAL CAPACITY OF BATTERY

[75] Inventor: Kazuhiro Hara, Wako, Japan

[73] Assignee: Honda Giken Kogyo Kabushiki Kaisha, Tokyo, Japan

[21] Appl. No.: 255,786

[22] Filed: Jun. 8, 1994

[30] Foreign Application Priority Data

Jun. 8, 1993 [JP] Japan .................. 5-137734

[51] Int. Cl.⁶ .......................... H02J 7/00; G01N 27/416
[52] U.S. Cl. .................. 320/48; 324/431; 324/435
[58] Field of Search .................. 320/2, 48; 324/427, 324/428, 430, 431, 435

[56] References Cited

U.S. PATENT DOCUMENTS

| | | | |
|---|---|---|---|
| 4,947,123 | 8/1990 | Minezawa | 320/48 |
| 5,352,968 | 10/1994 | Reni et al. | 320/48 |
| 5,352,982 | 10/1994 | Nakazawa et al. | 320/48 |
| 5,422,822 | 6/1995 | Toyota et al. | 324/427 |

FOREIGN PATENT DOCUMENTS 60-52641  6/1981  Japan .
1143984  6/1989  Japan .

*Primary Examiner*—Peter S. Wong
*Assistant Examiner*—Patrick B. Law
*Attorney, Agent, or Firm*—Lyon & Lyon

[57] ABSTRACT

A battery monitor system for monitoring the residual capacity of a battery has a controller for determining the residual capacity of a battery, detecting the output electric power of the battery when the battery is being discharged, and correcting the residual capacity depending on the output electric power such that as the output electric power of the battery increases, a new residual capacity produced when the residual capacity is corrected decreases. The residual capacity may be corrected by subtracting a residual capacity corrective value, which increases as the output electric power of the battery increases, from the residual capacity. The residual capacity of the battery can accurately be determined and monitored depending on the output electric power from the battery. In the case where the battery monitor system has a residual capacity display unit and is combined with an electric vehicle, the driver of the electric vehicle can visually recognize the residual capacity of the battery depending on the running condition of the electric vehicle.

14 Claims, 5 Drawing Sheets

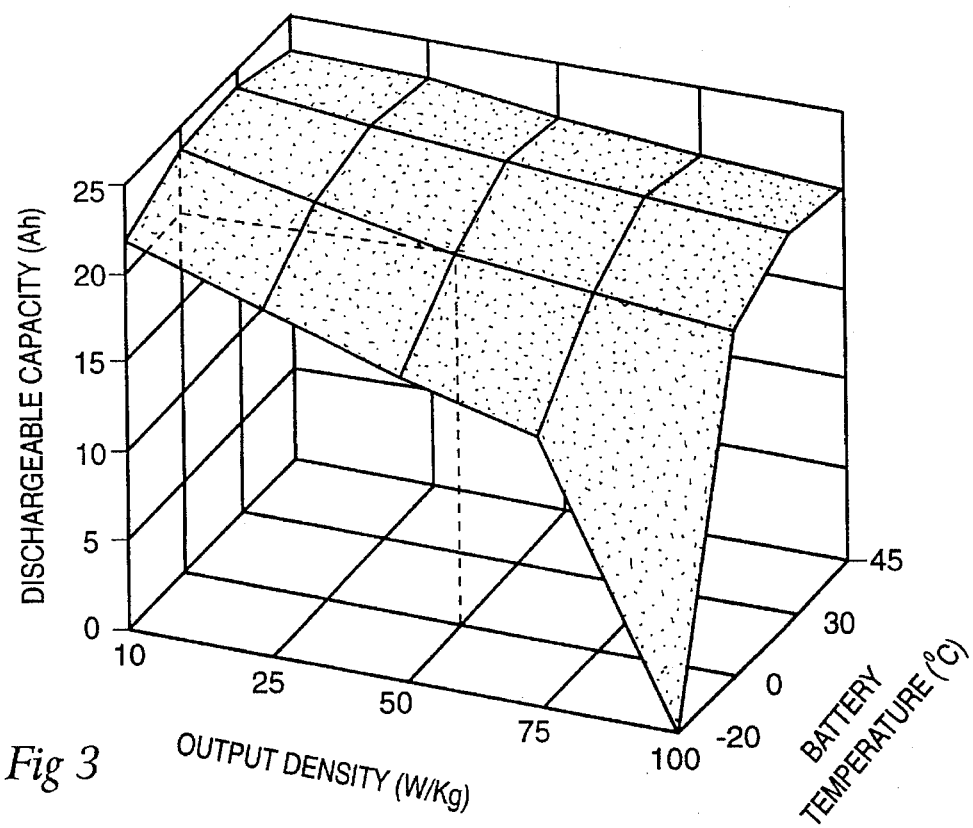
Fig 3
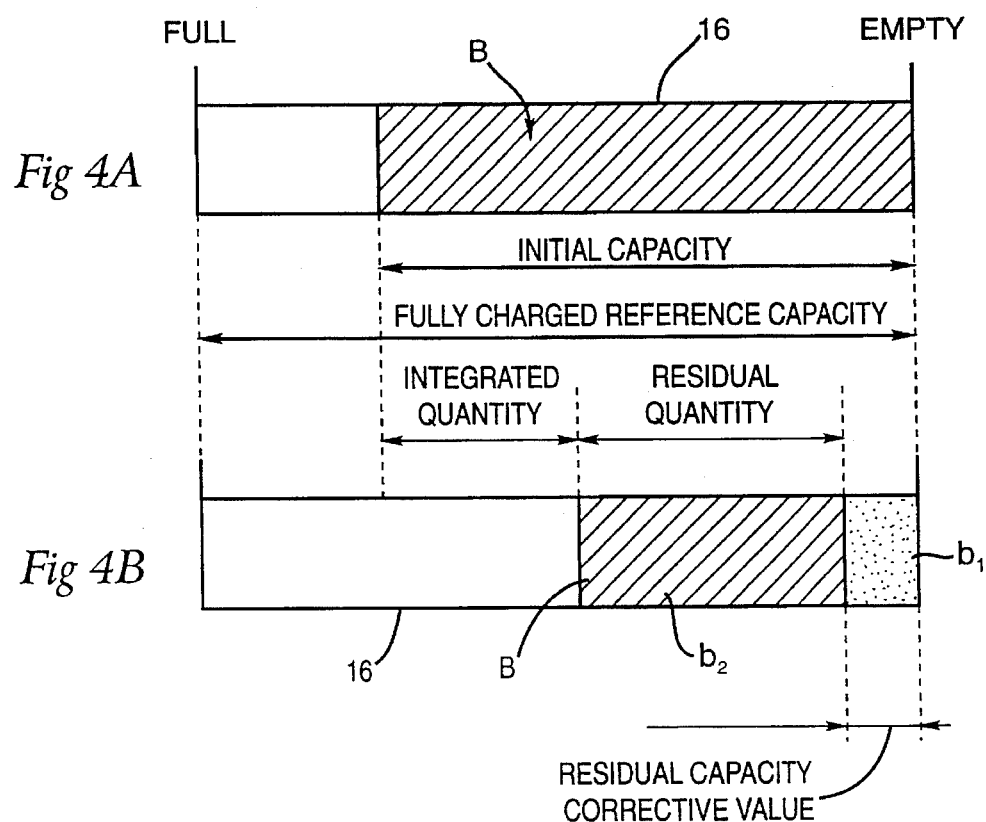
Fig 4A
Fig 4B

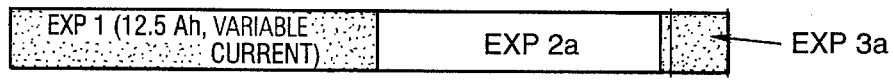
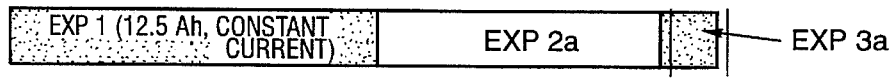
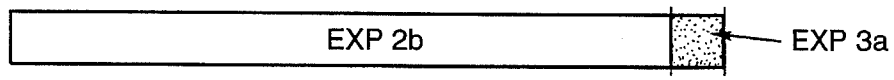
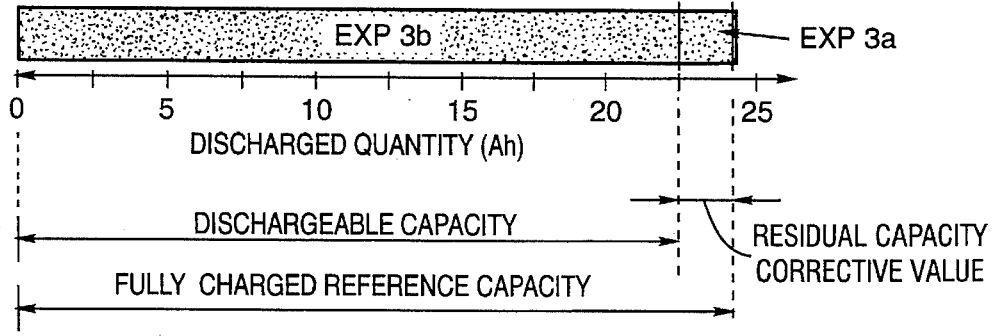

SYSTEM FOR MONITORING RESIDUAL CAPACITY OF BATTERY

BACKGROUND OF THE INVENTION

1. Field of the Invention

The present invention relates to a battery monitor system for monitoring the residual capacity of a battery such as a lead storage battery mounted on an electric vehicle or the like.

2. Description of the Prior Art

Electric vehicles are propelled by an electric motor which is supplied with the required electric energy from a battery such as a lead storage battery. It has been customary to detect the residual capacity of the battery, i.e., the amount of electric energy that can be discharged from the battery, according to any of various processes on a realtime basis, and display the detected residual capacity on a suitable display unit in the passenger's compartment for recognition by the driver.

One of the known processes for determining the residual capacity of the battery on a real-time basis is disclosed in Japanese laid-open patent publication No. 1-143984, for example. According to the disclosed process, the current discharged from the battery while the electric vehicle is running is detected from time to time, and the detected current is integrated. The integrated value is then subtracted from the initial capacity of the battery before the battery starts being discharged, i.e., before the electric vehicle starts running, and the differential value is corrected depending on the temperature of the battery, thereby determining the residual capacity of the battery.

The inventor has found out that the residual capacity of the battery generally varies depending the output voltage of the battery at the time it is discharged, and that the higher the output voltage, the lower the substantial residual capacity of the battery. Electric vehicles are generally controlled such that the electric energy supplied from the battery to the electric motor, i.e., the output electric power from the battery, while the electric vehicle is running is higher causing an increase in the mechanical output energy from the electric motor as the driver depresses the accelerator pedal more deeply. Therefore, it is preferable for the driver to recognize the residual capacity of the battery depending on the present amount of operation of the accelerator pedal or the present depth to which the accelerator pedal is depressed, i.e., the present output electric power of the battery. If informed of the residual capacity of the battery depending on the present output electric power of the battery, then the driver can recognize how far the electric vehicle can travel with the present rate of accelerator pedal depression, and hence can appropriately depress the accelerator pedal.

However, the conventional arrangement disclosed in Japanese laid-open patent publication No. 1-143984 does not detect the residual capacity of the battery depending on the present output electric power of the battery. Since the driver cannot know the residual capacity of the battery depending on the present rate of accelerator pedal depression, the driver is unable to have an idea about the real distance or range which the electric vehicle can cover with the recognized residual capacity.

There has also been proposed, as disclosed in Japanese patent publication No. 6-052641, a system for determining and displaying the residual capacity of a battery on an electric vehicle based on the amount of electric energy discharged from the battery, and determining and displaying the range that can be traversed by the electric vehicle based on the determined residual capacity of the battery. However, the proposed system also fails to take into account variations or fluctuations that are caused in the residual capacity of the battery by the output electric power from the battery. Consequently, the displayed residual capacity of the battery and the corresponding displayed range tend to be inaccurate.

SUMMARY OF THE INVENTION

It is therefore an object of the present invention to provide a system capable of monitoring the residual capacity of a battery on an electric vehicle highly accurately depending on the output electric power of the battery at the time it is discharged, for thereby allowing the driver of the electric vehicle to accurately recognize the residual capacity of the battery based on the running condition of the electric vehicle.

According to the present invention, there is provided a battery monitor system for monitoring the residual capacity of a battery, comprising residual capacity determining means for determining the residual capacity of a battery, electric power detecting means for detecting the output electric power of the battery when the battery is discharged, residual capacity correcting means for correcting the residual capacity determined by the residual capacity calculating means depending on the output electric power calculated detected by the electric power detecting and calculating means, such that as the output electric power of the battery increases, a new residual capacity is produced when the residual capacity is corrected by the residual capacity correcting means decreases.

The residual capacity correcting means may comprise means for correcting the residual capacity by subtracting a residual capacity corrective value, which increases as the output electric power of the battery increases, from the residual capacity determined by the residual capacity determining means.

The battery monitor system may further comprise discharging current detecting means for detecting a discharging current from the battery and discharging current integrating means for integrating the detected discharging current from the time when the battery starts being discharged, the residual capacity determining means comprising means for determining, as the residual capacity of the battery, a value produced by subtracting the integrated discharging current from an initial capacity of the battery at the time when the battery starts being discharged.

The battery monitor system may further comprise temperature detecting means for detecting the temperature of the battery, the residual capacity correcting means comprising means for correcting the residual capacity determined by the residual capacity determining means with the temperature detected by the temperature detecting means according to a predetermined rule which takes into account the effect that the temperature of the battery has on the residual capacity of the battery.

The battery monitor system may further comprise residual capacity displaying means for displaying the new residual capacity. The residual capacity displaying means may comprise means for displaying a reduction from the residual capacity determined by the residual capacity determining means to the new residual capacity. The battery monitor system may be combined with an electric vehicle comprising an electric motor energizable by the battery for propelling the electric vehicle and motor control means for controlling electric energy supplied from the battery to the electric motor depending on the amount of acceleration applied to the electric vehicle.

The residual capacity determined by the residual capacity determining means is corrected such that as the output electric power of the battery increases, a new residual capacity produced when the residual capacity is corrected by the residual capacity correcting means decreases. It is thus possible to recognize the effective residual capacity depending on the output electric power of the battery from the new residual capacity thus produced.

The residual capacity correcting means corrects the residual capacity by subtracting a residual capacity corrective value, which increases as the output electric power of the battery increases, from the residual capacity determined by the residual capacity determining means.

The discharging current from the battery is detected by the discharging current detecting means and integrated by the discharging current integrating means, and a value produced by subtracting the integrated discharging current from an initial capacity of the battery at the time when the battery starts being discharged is determined as the residual capacity of the battery.

The temperature of the battery is detected by the temperature detecting means, and the residual capacity is corrected with the temperature detected by the temperature detecting means. The temperature of the battery is taken into account because the residual capacity of the battery varies depending on the battery temperature as well as the output electric power from the battery.

The residual capacity displaying means allows the displayed new residual capacity to be easily recognized visually.

The residual capacity displaying means also displays a reduction from the residual capacity determined by the residual capacity determining means to the new residual capacity. Thus, the reduction in the residual capacity depending on the output electric power of the battery can easily be recognized visually.

In the case where the battery monitor system equipped with the residual capacity displaying means is combined with an electric vehicle, the driver of the electric vehicle can visually recognize the effective residual capacity of the battery depending on the amount of operation of the accelerator pedal of the electric vehicle.

The above and other objects, features and advantages of the present invention will become apparent from the following description when taken in conjunction with the accompanying drawings which illustrate a preferred embodiment of the present invention by way of example.

BRIEF DESCRIPTION OF THE DRAWINGS

FIG. 3 is a diagram showing a data table employed in the battery monitor system shown in FIG. 1;

FIGS. 4A and 4B are diagrams illustrative of how the residual capacity is displayed by the battery monitor system shown in FIG. 1;

FIGS. 5A through 5F are diagrams illustrative of verifying experiments relative to the detection of residual storage capacities detected by the battery monitor system shown in FIG. 1;

DETAILED DESCRIPTION OF THE PREFERRED EMBODIMENT

Figure 1:
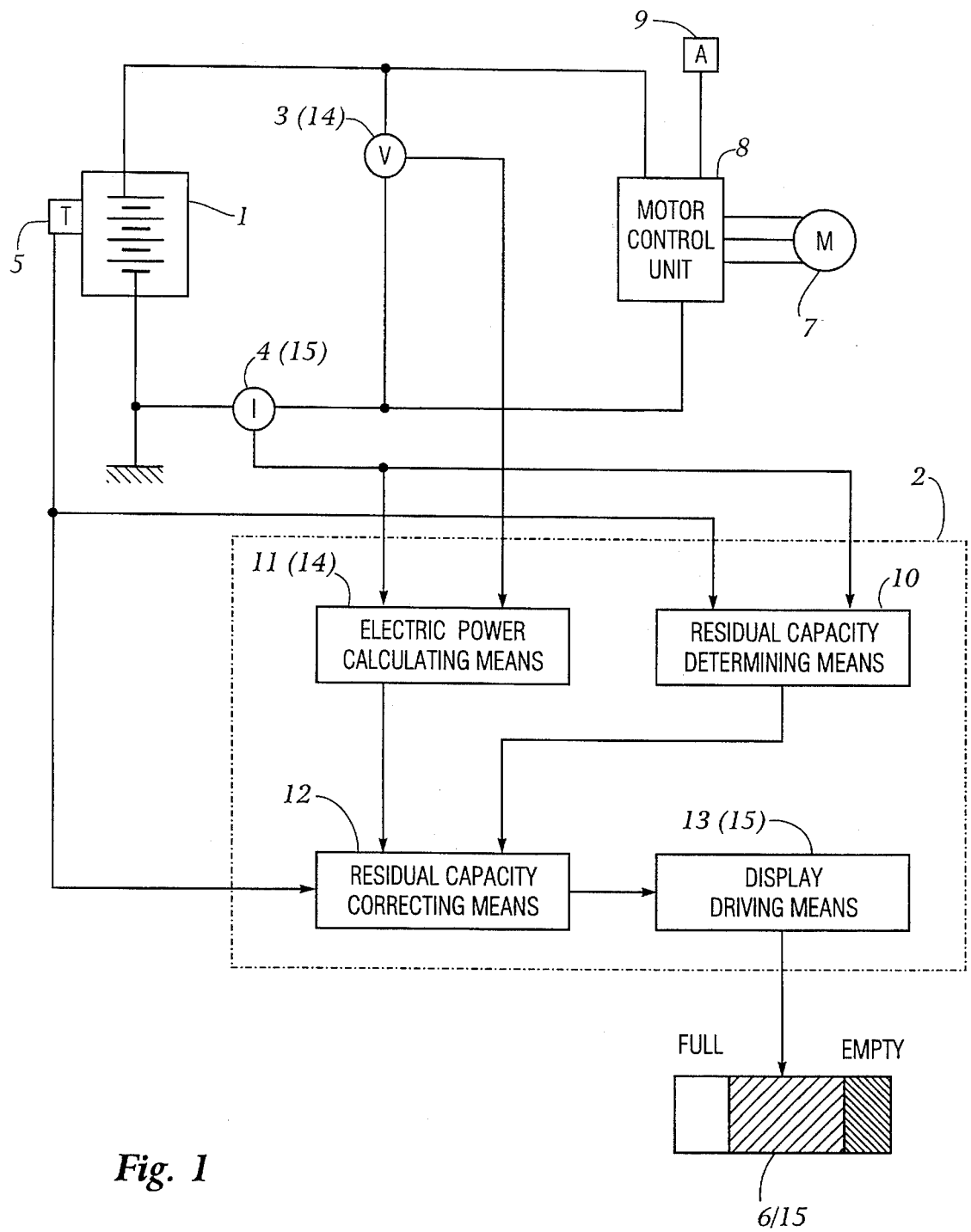
FIG. 1 is a block diagram of a battery monitor system for monitoring the residual capacity of a battery according to the present invention.

As shown in FIG. 1, a battery monitor system for monitoring the residual capacity of a battery according to the present invention is typically incorporated in an electric vehicle, for example. The battery monitor system includes a battery 1, a controller 2 for carrying out various arithmetic operations to detect and monitor the residual capacity of the battery 1, a voltage sensor 3 for detecting the output voltage of the battery 1, a current sensor (current detecting means) 4 for detecting a charging or discharging current I of the battery 1, a temperature sensor (temperature detecting means) 5 for detecting the temperature T of the battery 1, a residual capacity display unit 6 for displaying the residual capacity of the battery 1, an electric motor 7 for propelling the electric vehicle, a motor control unit (motor control means) 8 for controlling the electric motor 7, and an accelerator operation sensor 9 comprising a potentiometer or the like for detecting the amount A of operation of an accelerator pedal, e.g., the depth to which the accelerator pedal is depressed. The battery 1 may comprise, for example, a nickel-metal-halide battery (nickel-hydrogen battery).

The motor control unit 8 controls the supply of electric power from the battery 1 to the electric motor 7 to energize the electric motor 7. Basically, when the amount A of operation of the accelerator pedal as detected by the accelerator operation sensor 9 is increased, the motor control unit 8 increases the amount of output electric power supplied from the battery 1 to the electric motor 7, for thereby increasing the mechanical output energy from the electric motor 7. The mechanical output energy from the electric motor 7 is transmitted through a power transmitting system (not shown) to drive wheels (not shown) of the electric vehicle.

The controller 2 comprises an electronic circuit including a central processing unit (CPU), a random-access memory (RAM), a read-only memory (ROM), etc. The controller 2 functionally has a residual capacity determining means 10 for calculating the residual capacity of the battery 1 in a manner described later based on the discharging current I detected by the current sensor 4 when the battery 1 is being discharged, i.e., when the electric vehicle is running, and the battery temperature T detected by the temperature sensor 5, an electric power calculating means 11 for determining the output electric power W from the battery 1 according to the equation (1) given below based on the discharging current I detected by the current sensor 4 when the battery 1 is being discharged and the output voltage V detected across the battery 1 by the voltage sensor 5, a residual capacity correcting means 12 for correcting the residual capacity of the battery 1 determined by the residual capacity determining means 10 based on the output electric power W calculated by the electric power calculating means 11 and the battery temperature T detected by the temperature sensor 5, and a display driving means 13 for displaying the residual capacity corrected by the residual capacity correcting means 12 on the residual capacity display unit 6.

$$\text{Output electric power } W = \text{Output voltage } V \times \text{Discharging current } I \tag{1}$$

The current sensor 4, the voltage sensor 3, and the electric power calculating means 11 jointly serve as an electric power determining means 14 for determining the output electric power W from the battery 1 when the battery 1 is being discharged. The residual capacity display unit 6 and the display driving means 13 jointly serve as a residual capacity displaying means 15 for displaying the residual capacity of the battery 1.

As described in detail later on, the residual capacity display unit 6 comprises a bargraph display unit which indicates the residual capacity of the battery 1 with a bar graph.

Figure 2:
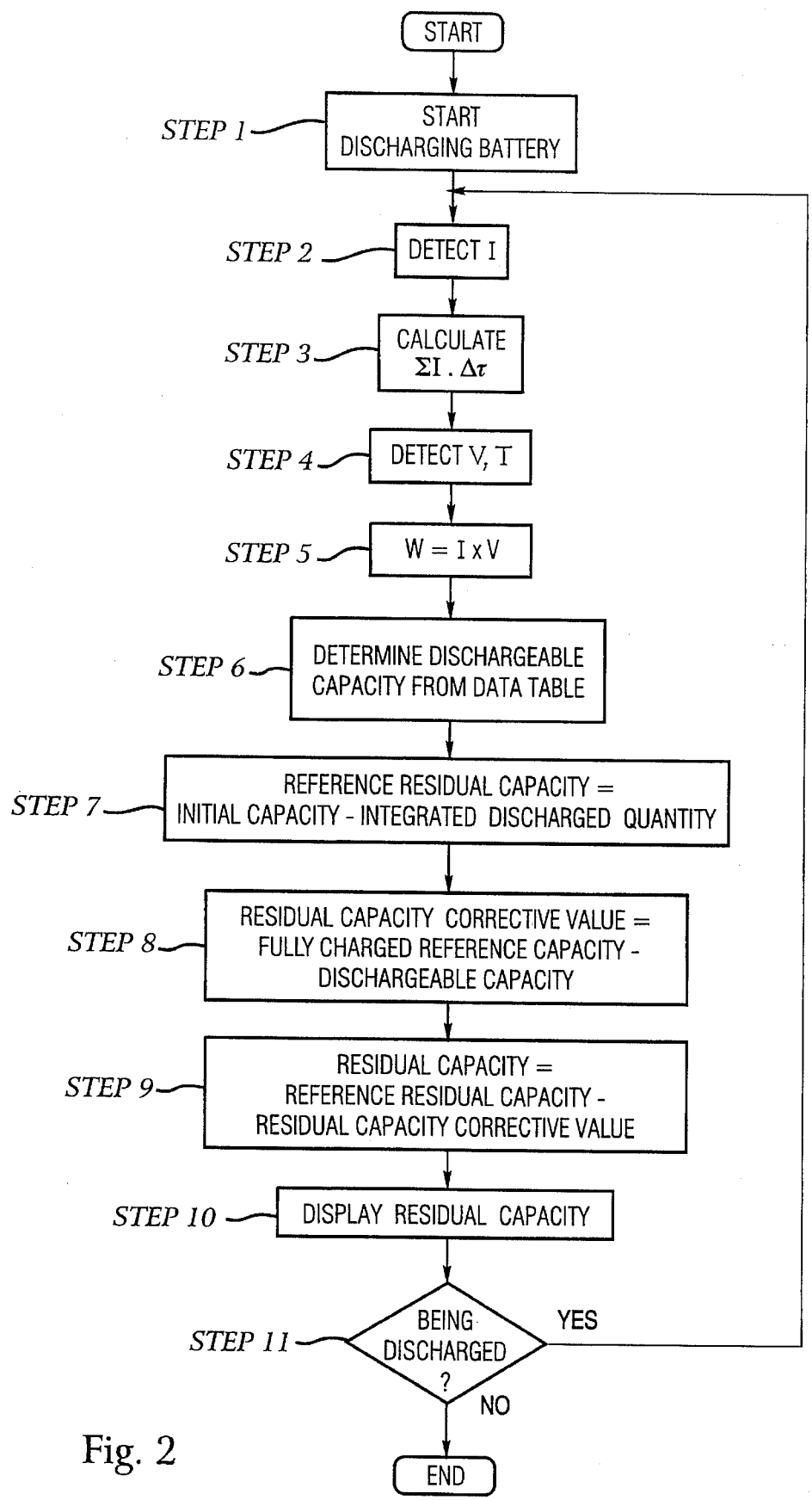
FIG. 2 is a flowchart of an operation sequence of the battery monitor system shown in FIG. 1.

Operation of the battery monitor system shown in FIG. 1 will be described below with reference to FIG. 2. When the electric vehicle starts running and the battery 1 starts being discharged in a step 1, the controller 2 detects the present discharging current I from the battery 1 through the current sensor 4 in a sufficiently short sampling time in a step 2. Then, the controller 2 integrates the detected discharging current I from the time when the battery 1 starts being discharged, according to the equation (2) below, and determines the integrated value as an integrated discharged quantity in a step 3.

$$\Sigma I \cdot \Delta t \left( \approx \int_0^t I dt \right) \tag{2}$$

where $\Delta t$ is the sampling time. The integrated discharged quantity calculated according to the equation (2) represents the total discharged quantity (coulomb) from the time when the battery 1 starts being discharged to the present time.

Then, the controller 2 detects the present output voltage V of the battery 1 through the voltage sensor 3 and also detects the battery temperature T through the temperature sensor 5 in a step 4. In a next step 5, the controller 2 calculates the output electric power W of the battery 1 according to the equation (1) above based on the discharging current I detected in the step 2 and the output voltage V detected in the step 4.

In a next step 6, the controller 2 determines, with the residual capacity correcting means 12, a dischargeable capacity from the battery temperature T detected in the step 4 and the output electric power W calculated in the step 5, using a predetermined data table shown in FIG. 3. Actually, electric power output density W/Kg, shown in FIG. 3, is used instead of just output electric power W. In FIG. 3, the dischargeable capacity represents a quantity of electric energy (coulomb) that can be discharged by the battery 1, which is fully charged, until the output voltage of the battery 1 becomes 1 V (=cutoff voltage), for example, assuming the output electric energy of the battery 1 and the battery temperature are constant, and the output density represents the output electric power W per unit weight of the battery 1. In FIG. 3, the dischargeable capacity is plotted as a function of the output density and the battery temperature. The data shown in FIG. 3 have been determined by actually discharging a fully charged battery at various values of the output density and the battery temperature and measuring discharged quantities of electric power. The data shown in FIG. 3 have basic trends that as the output density increases, the dischargeable capacity decreases, and as the battery temperature decreases, the dischargeable capacity decreases. The data includes a data area in which as the battery temperature increases in a relatively high battery temperature range, the dischargeable capacity slightly decreases.

In the step 6, the dischargeable capacity is determined from the present battery temperature T and the output electric power density W/kg using the data table shown in FIG. 3. For example, when the output density corresponding substantially to the present output electric power is 50 (W/kg) and the battery temperature T is 0° C., the dischargeable capacity determined from the data table shown in FIG. 3 is about 20, as shown by the dashed lines.

The step 6 is followed by a step 7 in which the controller 2 determines, with the residual capacity determining means 10, a reference residual capacity from the integrated discharged quantity determined in the step 3 according to the following equation (3):

$$\text{Reference residual capacity} = \text{Initial storage capacity} - \text{Integrated discharged quantity} \tag{3}$$

where the initial capacity is the capacity of the battery 1 at the time when the battery 1 starts being discharged (the electric vehicle starts running) in the step 1. If the battery 1 has been fully charged before it starts being discharged in a present cycle, i.e., before the electric vehicle starts running, then the initial capacity is set to the capacity of the battery 1 when it is fully charged. If the battery 1 has not been charged before it starts being discharged in a present cycle, then the initial capacity is set to the reference residual capacity at the time when the battery 1 stopped being discharged in a preceding cycle, i.e., when the electric vehicle stopped running.

The reference residual capacity determined according to the equation (3) and the initial capacity each represent a total quantity of electric energy that can be discharged from the battery 1 when the battery 1 is charged under certain given conditions. In this embodiment, such given conditions are a discharging current of 6 Amps and a cutoff voltage (which is the output voltage of the battery 1 at the time it is fully discharged) of 1 V. Specifically, the initial capacity represents a total quantity of electric energy which is obtained when the battery 1 is discharged at a discharging current of 6 Amps until the cutoff voltage is reached, i.e., until the output voltage becomes 1 V, before the electric vehicle starts running. The reference residual capacity represents a total quantity of electric energy which is obtained when the battery 1 at present is discharged under the same conditions. The initial capacity may be estimated from an open-circuit voltage of the battery 1, i.e., the output voltage of the battery 1 when it is open or is not connected to any load, before the battery 1 starts being discharged.

Thereafter, the controller 2 determines, with the residual capacity correcting means 12, a residual capacity corrective value for correcting the reference residual capacity determined according to the equation (3), using the dischargeable quantity determined in the step 6 according to the following equation (4) in a step 8:

$$\text{Residual capacity corrective value} = \text{Fully charged reference capacity} - \text{Dischargeable quantity} \tag{4}$$

where the fully charged reference capacity represents the capacity of the battery 1 when it has been discharged from the fully charged condition with the discharging current of 6 Amps and the cutoff voltage of 1 V. When the battery 1 is fully charged when it starts being discharged in the step 1, the fully charged reference capacity is the same as the initial capacity or the reference residual capacity at the time when the battery 1 starts being discharged. Since the dischargeable quantity represents a quantity of electric energy that can be discharged from the fully charged battery 1 at the output electric power W and the battery temperature T at present, the residual capacity corrective value which is obtained by subtracting the dischargeable quantity from the fully charged reference capacity represents a quantity of electric energy that cannot be extracted from the battery 1 at the output electric power W and the battery temperature T at present, i.e., a reduction in the storage quantity depending on the output electric power W and the battery temperature T at present. Inasmuch as the dischargeable quantity is smaller as the output electric power W of the battery 1 is greater, the residual capacity corrective value is greater as the output electric power W of the battery 1 is greater, i.e., as the amount A of operation of the accelerator pedal is greater.

Then, the controller 2 corrects, with the residual capacity correcting means 12, the reference residual capacity determined according to the equation (3) with the residual capacity corrective value determined according to the equation (4), according to the following equation (5), thereby to determine an effective residual capacity, i.e., a residual dischargeable quantity in a step 9:

$$\text{Effective residual capacity} = \text{Reference residual capacity} - \text{Residual capacity corrective value} \quad (5)$$

Because the residual capacity corrective value indicates a reduction in the storage quantity depending on the output electric power W and the battery temperature T at present, as described above, the residual capacity determined according to the equation (5) represents an effective total quantity of electric energy that can be discharged by the battery 1 at the output electric power W and the battery temperature T at present. Since the residual capacity corrective value is greater as the output electric power W is greater, the residual capacity determined according to the equation (5) is smaller as the output electric power W is greater.

In a next step 10, the controller 2 displays, with the display driving means 13, the residual capacity determined according to the equation (5) and the residual capacity corrective value determined according to the equation (4) on the residual capacity display unit 6 in a step 10. The display of these data will be described in detail later on.

The controller 2 determines whether the battery 1 is being discharged or not in a step 11. If the battery 1 still continues to be discharged, i.e., if the electric vehicle is running, (YES in the step 11), then the controller 2 repeats the process after the step 2 in the sampling time Δt. If the electric vehicle stops running and the battery 1 stops being discharged (NO in the step 11), then the operation sequence shown in FIG. 2 is finished.

The display of the residual capacity and the residual capacity corrective value on the residual capacity display unit 6 will be described below with reference to FIGS. 4A and 4B.

The residual capacity display unit 6 comprises a liquid crystal display element, for example, for displaying the residual capacity and the residual capacity corrective value with a bar graph B within a slender horizontal rectangular frame 16.

Before the electric vehicle starts running, i.e., before the battery 1 starts being discharged, one end (righthand end in FIG. 4A in the embodiment) of the rectangular frame 16 indicates an "EMPTY" position which represents that the battery 1 is fully discharged, and the other end (lefthand end in FIG. 4A in the embodiment) of the rectangular frame 16 indicates a "FULL" position which represents that the battery 1 is fully charged. The bar graph B which has a length depending on the initial capacity and extends from the "EMPTY" position toward the "FULL" position is displayed as liquid crystal display dots (shown hatched) in the rectangular frame 16. The full length of the bar graph B corresponds to the fully charged reference capacity. If the battery 1 is fully charged before the electric vehicle 1 starts running, the initial capacity of the battery 1 corresponds to the fully charged reference capacity, and the bar graph B is displayed across the entire length of the rectangular frame 16. As the initial capacity of the battery 1 is reduced, the length of the bar graph B from the "EMPTY" position is also reduced. For example, if the initial capacity of the battery 1 is ¾ of the fully charged reference capacity, then, as shown in FIG. 4A, the bar graph B displayed in the rectangular frame 16 has a length from the "EMPTY" position, which is ¾ of the entire length of the rectangular frame 16. Therefore, the driver of the electric vehicle can visually recognize the initial capacity of the battery 1 based on the length of the bar graph B with respect to the entire length of the rectangular frame 16.

When the electric vehicle starts running and the battery 1 starts being discharged, the length of the bar graph B from the "EMPTY" position is reduced by a value corresponding to the integrated discharged quantity. Near the "EMPTY" position, a bar graph portion $b_1$ (shown stippled) having a length from the "EMPTY" position, which corresponds to the residual capacity corrective value at present, is displayed in the bar graph B in a pattern different from the pattern of a remaining bar graph portion $b_2$ (shown hatched). The bar graph portion $b_1$ may be displayed as a de-energized area of the bar graph portion $b_2$ or in a color different from the bar graph portion $b_2$. As is apparent from the equation (3), the length of the bar graph B from the "EMPTY" position corresponds to the reference residual capacity. Since the bar graph portion $b_1$ corresponds to the residual capacity corrective value depending on the output electric power W and the battery temperature T at present, the length of the bar graph portion $b_2$ corresponds to the effective residual capacity depending on the output electric power W and the battery temperature T at present as can be seen from the equation (5). The bar graph portion $b_1$ will hereinafter be referred to as a "corrective value display portion $b_1$," and the bar graph portion $b_2$ as a "residual capacity display portion $b_2$". Consequently, the driver of the electric vehicle can visually recognize the effective residual capacity depending on the output electric power W and the battery temperature T at present, stated otherwise, the amount A of operation of the accelerator pedal and the battery temperature T at present. The driver can also visually recognize, from the length of the corrective value display portion $b_1$, a reduction in the residual capacity of the battery 1 depending on the amount A of operation of the accelerator pedal and the battery temperature T at present. The boundary between the corrective value display portion $b_1$ and the residual capacity display portion $b_2$ indicates a virtual "EMPTY" position for the residual capacity of the battery 1. This virtual "EMPTY" position moves in the rectangular frame 16 as the output electric power W of the battery 1 varies, stated otherwise, as the amount A of operation of the accelerator pedal varies.

The sum of the lengths of the corrective value display portion $b_1$ and the residual capacity display portion $b_2$ becomes shorter as the battery 1 is continuously discharged.

When the discharging of the battery 1 is temporarily interrupted at the time the electric vehicle is temporarily stopped, for example, the length of the corrective value display portion $b_1$ becomes nil, and only the residual capacity display portion $b_2$ is displayed.

Verifying experiments relative to the detection of residual storage capacities detected by the battery monitor system shown in FIG. 1 will be described below.

The inventor conducted experiments on storage batteries (Ni-MH batteries) of a rated capacity of 25 Ah which have rare-earth metal-halide cells as follows:

EXPERIMENT 1

A storage battery was fully charged for 12 hours with a charging current of 3 Amps at a battery temperature of 30° C., and then discharged to given quantities of discharged electric energy. The quantities of discharged electric energy represented measured discharging currents integrated with respect to time (see the equation (2) above), and had values of 20 Ah and 12.5 Ah, respectively. For each of these quantities of discharged electric energy, the storage battery was discharged in a variable-current mode in which the discharging current had various values and a constant-current mode in which the discharging current had a constant value. The Experiment 1 is an experiment for simulating the steps 1 through 3 shown in FIG. 2, and the quantities of discharged electric energy which have the values of 20 Ah and 12.5 Ah represent integrated discharged quantities described above.

EXPERIMENT 2

The storage battery which was subjected to the Experiment 1 was discharged at the same temperature as in the Experiment 1 with the output density of 50 W/kg (constant) and the cutoff voltage of 1 V, and the discharging current integrated with respect to time was measured. The Experiment 2 (which is also referred to as an "Experiment 2a") is an experiment for measuring an actual residual capacity of the storage battery which was discharged in the Experiment 1, at the battery temperature of 30° C. and the output density of 50 W/kg.

A fully charged storage battery which was not discharged in the Experiment 1 was also discharged at the same temperature as in the Experiment 1 with the output density of 50 W/kg (constant) and the cutoff voltage of 1 V, and the discharging current integrated with respect to time was measured. This Experiment (which is also referred to as an "Experiment 2b") is an experiment for measuring an actual residual capacity of the storage battery whose integrated discharged quantity is nil, at the battery temperature of 30° C. and the output density of 50 W/kg. As is apparent from the above definition of the dischargeable capacity, the residual capacity measured in the Experiment 2b corresponds to the dischargeable capacity. The dischargeable capacities in the data table shown in FIG. 3 have been obtained by effecting the same experiment as the Experiment 2b on a storage battery with respect to various values of the battery temperature and the output electric power (output density). The residual capacity measured in the Experiment 2b is in agreement with the dischargeable capacity shown in FIG. 3 at the battery temperature of 30° C. and the output density of 50 W/kg.

EXPERIMENT 3

The storage batteries which were subjected to the Experiment 2 were discharged at the same temperature as in the Experiment 1 at a discharging current of 6 Amps and a cutoff voltage of 1 V, and the quantities of discharged energy were measured. The Experiment 3 (which is also referred to as an "Experiment 3a") is an experiment for measuring a capacity which cannot be discharged in the Experiment 2, the capacity corresponding to the residual capacity corrective value.

A fully charged storage battery which was not subjected to the Experiments 1 and 2 was also discharged at the same temperature as in the Experiment 1 at a discharging current of 6 Amps and a cutoff voltage of 1 V, and the quantities of discharged energy were measured. This Experiment (which is also referred to as an "Experiment 3b") is an experiment for measuring the fully charged reference capacity as can be understood from the above definition thereof.

The results of the above Experiments are shown in FIGS. 5A–5F. FIGS. 5A–5D show bar graphs representing the quantities of discharged electric energy and their sums which were obtained in the Experiments 1, 2a, 3a. Specifically, the bar graph shown in FIG. 5A represents the experimental results produced when the storage battery was discharged at 20 Ah in the variable-current mode in the Experiment 1. The bar graph shown in FIG. 5B represents the experimental results produced when the storage battery was discharged at 20 Ah in the constant-current mode in the Experiment 1. The bar graph shown in FIG. 5C represents the experimental results produced when the storage battery was discharged at 12.5 Ah in the variable-current mode in the Experiment 1. The bar graph shown in FIG. 5D represents the experimental results produced when the storage battery was discharged at 12.5 Ah in the constant-current mode in the Experiment 1. FIG. 5E shows a bar graph representing the quantities of discharged electric energy and their sum which were obtained in the Experiments 2b, 3a. FIG. 5F shows a bar graph representing the quantity of discharged electric energy which was obtained in the Experiment 3b.

The quantity of discharged electric energy in the Experiment 3b shown in FIG. 5F represents the fully charged reference capacity of the battery. The quantity of discharged electric energy in the Experiment 2b shown in FIG. 5D represents the residual capacity (dischargeable capacity) of the battery at the time the battery started being discharged at the battery temperature of 30° C. and the output density of 50 W/kg. The quantities of discharged electric energy in the Experiment 2a shown in FIGS. 5A–5D represent the residual capacities measured at the battery temperature of 30° C. and the output density of 50 W/kg after the battery was discharged in the Experiment 1. The quantities of discharged electric energy in the Experiment 3a shown in FIGS. 5A–5E represent capacities that could not be discharged in the Experiment 2. FIGS. 5A–5F also show residual capacity corrective values determined according to the equation (4), in lengths commensurate with the lengths of the bar graphs. In determining the residual capacity corrective values, the quantity of discharged electric energy in the Experiment 3b shown in FIG. 5F and the quantity of discharged electric energy (which is in agreement with the dischargeable capacity obtained from the data table shown in FIG. 3) in the Experiment 2b shown in FIG. 5E were used respectively as the fully charged reference capacity and the dischargeable capacity in the equation (4).

The degree of accuracy of the residual capacity and the residual capacity corrective value which can be determined by the battery monitor system will be described below with reference to FIGS. 5A–5F.

In the above embodiment, if the initial capacity of a battery is equal to the capacity of the battery when it is fully charged, i.e., the fully charged reference capacity of the battery, then as is apparent from the equations (3) through (5), the sum of the integrated quantity of discharged electric energy from the time when the battery starts being discharged and the residual capacity which is finally determined is equal to the dischargeable quantity.

A comparison between the bar graphs shown in FIGS. 5A–5D and the bar graph shown in FIG. 5E indicates that the sums of the integrated quantities of discharged electric energy in the Experiment 1 and the measured residual capacities in the Experiment 2a in FIGS. 5A–5D are substantially the same as the quantity of discharged electric energy (=dischargeable quantity) in the Experiment 2b in FIG. 5E. As a matter of fact, the sums of the integrated quantities of discharged electric energy in the Experiment 1 and the measured residual capacities in the Experiment 2a in FIGS. 5A–5D agreed highly accurately with the dischargeable quantity in the Experiment 2b in FIG. 5E as shown in the Table given below if the dischargeable quantity in the Experiment 2b in FIG. 5E was 100%.

It can be seen from the above analysis that the residual capacity which can be determined by the battery monitor system is highly accurate.

TABLE

| FIG. No | SUM 1 | SUM 2 |
|---------|-------|-------|
| FIG. 5A | 98.6% | 100.8% |
| FIG. 5B | 98.2% | 98.5% |
| FIG. 5C | 99.0% | 100.7% |
| FIG. 5D | 98.5% | 99.2% |
| FIG. 5E | 100.0% | 99.6% |
| FIG. 5F | — | 100.0% |

SUM 1: The quantity of discharged electric energy in the Experiment 1 + the quantity of discharged electric energy in the Experiment 2 (dischargeable capacity: 100%)
SUM 2: The quantity of discharged electric energy in the Experiment 1 + the quantity of discharged electric energy in the Experiment 2 + quantity of discharged electric energy in the Experiment 3 (fully charged reference capacity: 100%)

If the initial capacity of the battery is equal to the fully charged capacity (=the fully charged reference capacity), then the sum of the integrated quantity of discharged electric energy from the time the battery starts being discharged, the residual capacity determined finally, and the residual capacity corrective value agrees with the fully charged reference capacity.

A comparison between the bar graphs shown in FIGS. 5A–5E and the bar graph shown in FIG. 5F indicates that the sums of the integrated quantities of discharged electric energy in the Experiment 1 (the integrated quantity of discharged electric energy=0 in FIG. 5E), the measured residual capacities in the Experiment 2, and the quantity of discharged electric energy in the Experiment 3 which indicates a capacity that could not be discharged in the Experiment 2, in FIGS. 5A–5E are substantially the same as the quantity of discharged electric energy (=fully charged reference quantity) in the Experiment 3b in FIG. 5F. As a matter of fact, the sums of the integrated quantities of discharged electric energy in the Experiment 1, the measured residual capacities in the Experiment 2, and the quantity of discharged electric energy in the Experiment 3 agreed highly accurately with the fully charged reference capacity shown in FIG. 5F as shown in Table given below if the quantity of discharged electric energy (=fully charged reference capacity) in the Experiment 3b in FIG. 5F was 100%.

It follows, therefore, that the residual capacity corrective value determined according to the equation (4) is highly accurate as representing a capacity that cannot be discharged depending on the output electric power and the battery temperature at the time the battery is discharged, stated otherwise, as representing a reduction in the capacity of the battery.

The inventor conducted the above verifying experiments under various conditions, i.e., various values of the output electric power and the battery temperature, and compared residual capacities of batteries and residual capacity corrective values which were determined in the battery monitor system with measured values. As a result, the inventor confirmed that any error of the determined values with respect to the measured values fell in a range of 5%.

With the battery monitor system according to the present invention, a reference residual capacity produced by subtracting an integrated quantity of discharged electric energy from the initial capacity of a battery on an electric vehicle is corrected depending on the output electric power of the battery and the temperature thereof at each point of time for accurately determining an effective residual capacity of the battery depending on the output electric power and the temperature of the battery. The residual capacity and a residual capacity corrective value are displayed to allow the driver of the electric vehicle to visually recognize the residual capacity and the residual capacity corrective value as depending on the amount A of operation of the accelerator pedal while driving the electric vehicle. By confirming the displayed data, the driver can easily predict the distance or range which the electric vehicle can travel, and also appropriately adjust amount A of operation of the accelerator pedal based on the residual capacity of the battery.

While the fully charged reference capacity of the battery has been described as being the capacity of the battery when it has been discharged from the fully charged condition with the discharging current of 6 Amps and the cutoff voltage of 1 V. However, the fully charged reference capacity of the battery may be such a capacity that allows a minimum amount of output electric power capable of energizing the electric motor 7 to be drawn from the battery 1. Such a fully charged reference capacity setting is practically preferable because the electric vehicle can run reliably on the battery even when the determined residual capacity of the battery is nil.

The present invention has been described with respect to determining and monitoring the Ni-MH battery 1. However, the principles of the present invention are also applicable to other batteries than the Ni-MH battery, such as a lead storage battery, an alkaline battery, and the like.

In the illustrated embodiment, the residual capacity of the battery 1 is corrected depending on both the battery temperature and the output electric power of the battery. However, it is possible to correct the residual capacity of the battery 1 depending on either the battery temperature or the output electric power of the battery. In such a case, the residual capacity of the battery 1 may be corrected depending on the battery temperature by the residual capacity determining means 10.

In the illustrated embodiment, the residual capacity of the battery 1 is determined by subtracting the residual capacity corrective value determined depending on the battery temperature and the output electric power of the battery from the reference residual capacity. However, it is possible to determine the residual capacity of the battery 1 by multiplying the reference residual capacity by a corrective coefficient of 1 or less which becomes smaller as the output electric power of the battery becomes greater.

Figure 6:
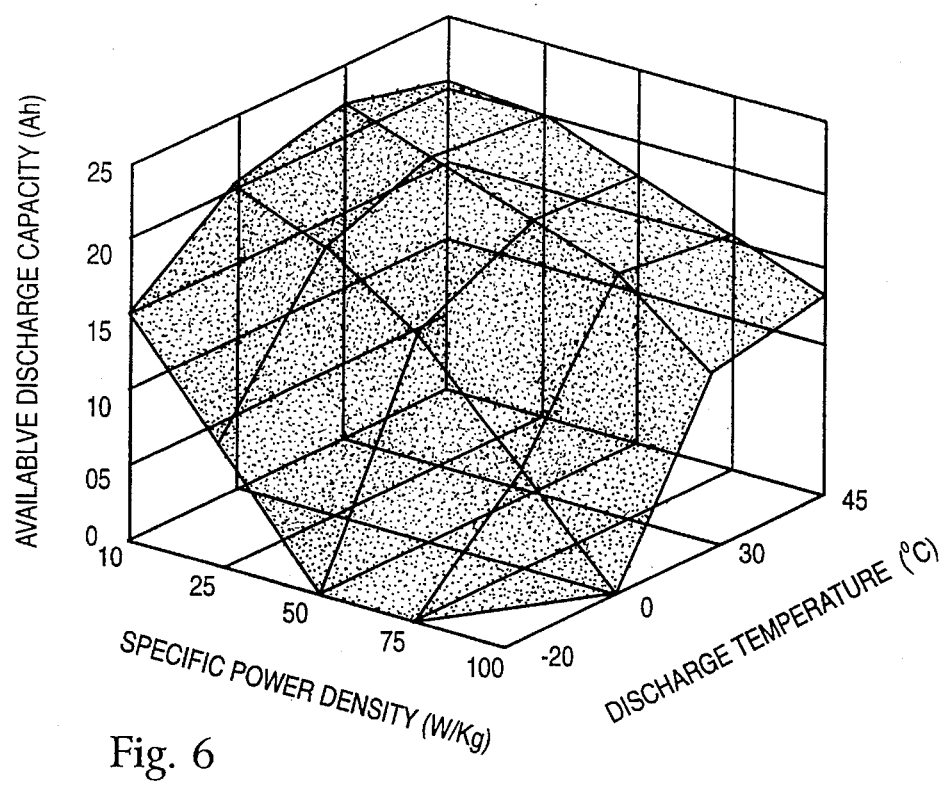
FIG. 6 is a diagram showing a data table employed in the battery monitor system when internal resistance of the battery increases.

When the battery is repeatedly charged and discharged, internal resistance increases. This increase of the internal resistance indicates a degree of capacity depletion of the battery. (This capacity depletion means capacity loss.) As a result of this capacity depletion of the battery, practicable discharge capacity decreases as shown in FIG. 6. Therefore the residual capacity can be alternatively displayed after being reduced to a dead capacity as a result of the increase of internal resistance of the battery. The internal resistance of the battery may be calculated at any time by an internal resistance calculating means based on the battery output voltage V and current I measured by the voltage sensor 3 and current sensor 4, respectively, and Ohms Law E=IR restated as Resistance R=V÷I.

Figure 7:
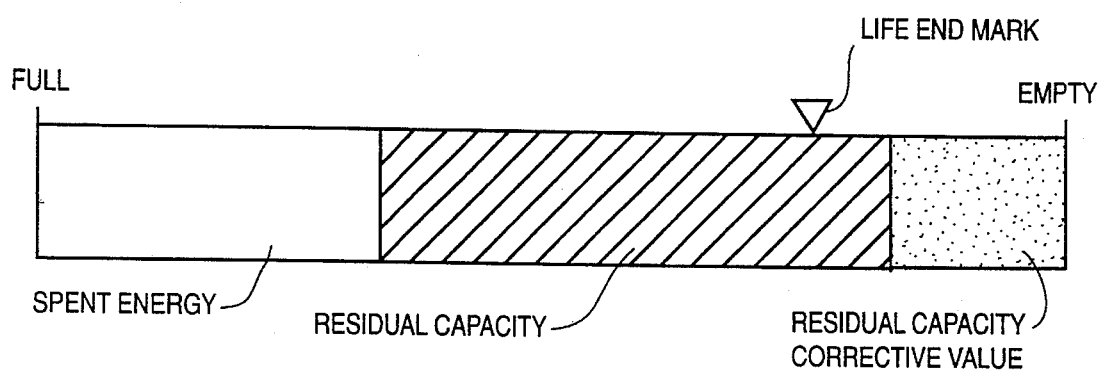
FIG. 7 is a diagram of a display panel which indicates a life end mark.

The dead capacity cause of the increase of the internal resistance, increases irreversibly until a new battery is substituted. So a life end mark of the battery may be displayed as shown in FIG. 7.

Although a certain preferred embodiment of the present invention has been shown and described in detail, it should be understood that various changes and modifications may be made therein without departing from the scope of the appended claims.

What is claimed is:

1. A battery monitor system for monitoring the residual capacity of a battery, comprising:

residual capacity determining means for determining the residual capacity of the battery;

electric power determining means for detecting voltage and current and calculating the output electric power of the battery based on the detected voltage and current when the battery is being discharged; and residual capacity correcting means for correcting the residual capacity determined by said residual capacity determining means depending on the output electric power calculated by said electric power determining means, such that as the output electric power of the battery increases, an updated residual capacity produced when the residual capacity is corrected by said residual capacity correcting means decreases.

2. A battery monitor system according to claim 1, wherein said residual capacity correcting means comprises means for correcting the residual capacity by subtracting a residual capacity corrective value, which increases as the output electric power of the battery increases, from the residual capacity determined by said residual capacity determining means.

3. A battery monitor system according to claim 1, wherein said electric power determining means includes:

discharging current detecting means for detecting a discharging current from the battery; and discharging current integrating means for integrating the detected discharging current from the time when the battery starts being discharged;

said residual capacity determining means comprising means for determining a present residual capacity of the battery as a value produced by subtracting the present integrated discharging current from an initial capacity of the battery at the time when the battery started being discharged.

4. A battery monitor system according to claim 1, further comprising:

temperature detecting means for detecting the temperature of the battery;

said residual capacity correcting means comprising means for correcting the residual capacity determined by said residual capacity determining means based on the temperature detected by said temperature detecting means according to a predetermined rule which takes into account an effect that the temperature of the battery has on the residual capacity of the battery.

5. A battery monitor system according to claim 1, further comprising:

residual capacity displaying means for displaying said updated residual capacity.

6. A battery monitor system according to claim 5, wherein said residual capacity displaying means comprises means for displaying a reduction from the residual capacity determined by said residual capacity determining means to said updated residual capacity.

7. A battery monitor system according to claim 5 or 6, in combination with an electric vehicle comprising:

an electric motor energizable by said battery for propelling the electric vehicle; and motor control means for controlling electric energy supplied from said battery to said electric motor depending on the amount of acceleration control applied to the electric vehicle.

8. A battery monitor system for monitoring the residual capacity of a battery, comprising:

residual capacity determining means for determining the residual capacity of the battery;

electric power calculating means for calculating the output electric power of the battery when the battery is being discharged;

residual capacity correcting means for correcting the residual capacity determined by said residual capacity determining means based on said calculated output electric power; and display means for indicating spent energy, the residual capacity and a residual capacity corrective value determined by said correcting means.

9. A battery monitor system for monitoring the residual capacity of a battery comprising:

residual capacity determining means for determining the residual capacity of the battery;

electric power calculating means for calculating the output electric power of the battery when the battery is being discharged;

battery internal resistance calculating means residual capacity correcting means for correcting the residual capacity determined by said residual capacity determining means depending on the output electric power calculated by said electric power calculating means and depending on a dead capacity caused by an increase in internal resistance as calculated by said battery internal resistance calculating means; and display means for indicating spent energy, the residual capacity and a residual capacity corrective value determined by said correcting means.

10. A battery monitor system according to claim 1, 8 or 9 further comprising:

means for repeatedly performing the steps of determining the residual capacity of the battery, calculating the output electric power of the battery, and correcting the residual capacity of the battery.

11. A battery monitor system according to claim 1, 8 or 9 wherein the residual capacity correcting means includes a look-up table of predetermined dischargeable capacity values of the battery based on values of temperature of the battery and output density of the battery for use in said residual capacity correcting means for correcting the residual capacity of the battery.

12. A battery monitor system according to claim 8 or 9 wherein the display means includes means for indicating a life end mark of the battery.

13. A battery monitor system for monitoring the residual capacity of a battery, comprising:

residual capacity determining means for determining the residual capacity of the battery at the time the battery starts being-discharged;

detecting means for repeatedly detecting the voltage and current of the battery during discharge;

discharging current integrating means for integrating the detected discharging current from the time the battery starts being discharged;

electric power calculating means for calculating the output electric power of the battery based on the detected voltage and the detected current when the battery is being discharged; and residual capacity correcting means for correcting the residual capacity determined by said residual capacity determining means depending on the output electric power calculated by said electric power calculating means for determining an updated residual capacity, said updated residual capacity determined when the residual capacity is corrected by said residual capacity correcting means decreasing as the output electric power increases.

14. A battery monitor system for monitoring the residual capacity of a battery, comprising:

residual capacity determining means for determining the residual capacity of the battery at the time the battery starts being discharged;

detecting means for repeatedly detecting the voltage and current of the battery during discharge;

discharging current integrating means for integrating the detected discharging current from the time the battery starts being discharged;

electric power calculating means for calculating the output electric power of the battery based on the detected voltage and the detected current when the battery is being discharged;

residual capacity correcting means for correcting the residual capacity determined by said residual capacity determining means based on the calculated output electric power; and display means for indicating spent energy, the residual capacity and a residual capacity corrective value determined by said correcting means.

* * * * *